United States Patent
Choi

(10) Patent No.: US 12,431,199 B2
(45) Date of Patent: Sep. 30, 2025

(54) MEMORY DEVICE AND OPERATING METHOD OF THE MEMORY DEVICE

(71) Applicant: SK hynix Inc., Icheon-si (KR)

(72) Inventor: Young Hwan Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 237 days.

(21) Appl. No.: 18/304,189

(22) Filed: Apr. 20, 2023

(65) Prior Publication Data

US 2024/0145008 A1 May 2, 2024

(30) Foreign Application Priority Data

Oct. 31, 2022 (KR) .......................... 10-2022-0142643

(51) Int. Cl.
| | |
|---|---|
| G11C 11/34 | (2006.01) |
| G11C 16/10 | (2006.01) |
| G11C 16/12 | (2006.01) |
| G11C 16/34 | (2006.01) |

(52) U.S. Cl.
CPC ............ *G11C 16/102* (2013.01); *G11C 16/12* (2013.01); *G11C 16/3459* (2013.01)

(58) Field of Classification Search
CPC ......... G11C 16/10; G11C 16/30; G11C 16/12; G11C 16/0483; H01L 27/115

USPC ................................ 365/185.18, 195, 185.22
See application file for complete search history.

(56) References Cited

U.S. PATENT DOCUMENTS

2020/0356153 A1* 11/2020 Kim ...................... G06F 1/3275
2021/0343352 A1* 11/2021 Cho ........................ G11C 16/26

FOREIGN PATENT DOCUMENTS

| KR | 1020210087412 A | 7/2021 |
| KR | 1020220045769 A | 4/2022 |

* cited by examiner

*Primary Examiner* — Son T Dinh
(74) *Attorney, Agent, or Firm* — WILLIAM PARK AND ASSOCIATES LTD.

(57) ABSTRACT

A memory device, and an operating method of the memory device, includes a plurality of memory cells connected between word lines and bit lines and a voltage generator for generating a program voltage or a pass voltage, which is applied to the word lines. The memory device also includes a page buffer group for applying program allow voltages or a program inhibit voltage to the bit lines and a control circuit for controlling the voltage generator and the page buffer group in response to a command. In a program operation of selected memory cells connected to a selected word line among the word lines, the control circuit controls the page buffer group such that the program allow voltages are increased stepwise according to a number of program loops performed on the selected memory cells.

25 Claims, 12 Drawing Sheets

MEMORY DEVICE AND OPERATING METHOD OF THE MEMORY DEVICE

CROSS-REFERENCE TO RELATED APPLICATION

The present application claims priority under 35 U.S.C. § 119(a) to Korean patent application number 10-2022-0142643, filed on Oct. 31, 2022, in the Korean Intellectual Property Office, the entire disclosure of which is incorporated herein by reference.

BACKGROUND

1. Technical Field

The present disclosure generally relates to a memory device and an operating method of the memory device, and more particularly, to a memory device configured to perform a program operation and an operating method of the memory device.

2. Related Art

A memory device may include a memory cell array in which data is stored, a peripheral circuit configured to perform a program, read, or erase operation, and control logic configured to control the peripheral circuit.

The memory cell array may include a plurality of memory blocks, and each of the plurality of memory blocks may include a plurality of strings. Each of the strings may include memory cells. In a memory device formed in a three-dimensional structure, strings may extend in a vertical direction from a substrate. Therefore, memory cells may be stacked in the vertical direction on the substrate.

The peripheral circuit may be connected to the memory cell array through word lines and bit lines. The peripheral circuit may program, read, or erase memory cells included in the memory cell array by adjusting voltages applied to the word lines and the bit lines.

The control circuit may control the peripheral circuit in response to a command and an address. The control circuit may include software configured to allow a program, read, or erase operation to be performed in response to the command. The control circuit may include hardware configured to divide the address into a row address and a column address, and output various signals under the control of the software.

The memory cells may store one-or-more-bit data according to a program manner. For example, the memory cells may be programmed in a single-level cell (SLC) manner, a multi-level cell (MLC) manner, a triple-level cell (TLC) manner, a quad-level cell (QLC) manner, or the like. In the SLC manner, one-bit data may be stored in a memory cell. In the MLC manner, two-bit data may be stored in a memory cell. In the TLC manner, three-bit data may be stored in a memory cell. In the QLC manner, four-bit data may be stored in a memory cell. In addition, five-or-more-bit data may be stored in a memory cell.

As the bit number of data stored in a memory cell increases, the distance between threshold voltages of memory cells storing different data is narrowed, and therefore, the memory device may be less reliable.

SUMMARY

In accordance with an embodiment of the present disclosure, a memory device includes: a plurality of memory cells connected between word lines and bit lines; a voltage generator configured to generate a program voltage or a pass voltage, which is applied to the word lines; a page buffer group configured to apply program allow voltages or a program inhibit voltage to the bit lines; and a control circuit configured to control the voltage generator and the page buffer group in response to a command. In a program operation of selected memory cells connected to a selected word line among the word lines, the control circuit controls the page buffer group such that the program allow voltages are increased stepwise according to a number of program loops performed on the selected memory cells.

In accordance with the present disclosure, a method of operating a memory device includes: applying a program inhibit voltage to unselected bit lines connected to unselected memory cells, while a program voltage is applied to a selected word line connected to selected memory cells; applying a first program allow voltage to first selected bit lines connected to memory cells having a threshold voltage lower than a sub-verify voltage among the selected memory cells, while the program voltage is applied to the selected word line; applying a second program allow voltage higher than the first program allow voltage to second selected bit lines connected to memory cells having a threshold voltage between a main verify voltage higher than the sub-verify voltage and the sub-verify voltage among the selected memory cells, while the program voltage is applied to the selected word line; and applying a third program allow voltage higher than the second program allow voltage to the second selected bit lines to which the second program allow voltage is applied according to a number of program loops performed on the selected memory cells.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be enabling to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural and functional descriptions disclosed herein are merely illustrative for the purpose of describing embodiments according to the concept of the present disclosure. Additional embodiments according to the concept of the present disclosure can be implemented in various forms. Thus, the present disclosure should not be construed as limited to the embodiments set forth herein.

Hereinafter, it will be understood that, although the terms "first," "second," etc. may be used herein to describe various elements, these elements should not be limited by these terms. These terms are only used to distinguish one element from another element and not to imply an order or number of elements.

Figure 1:
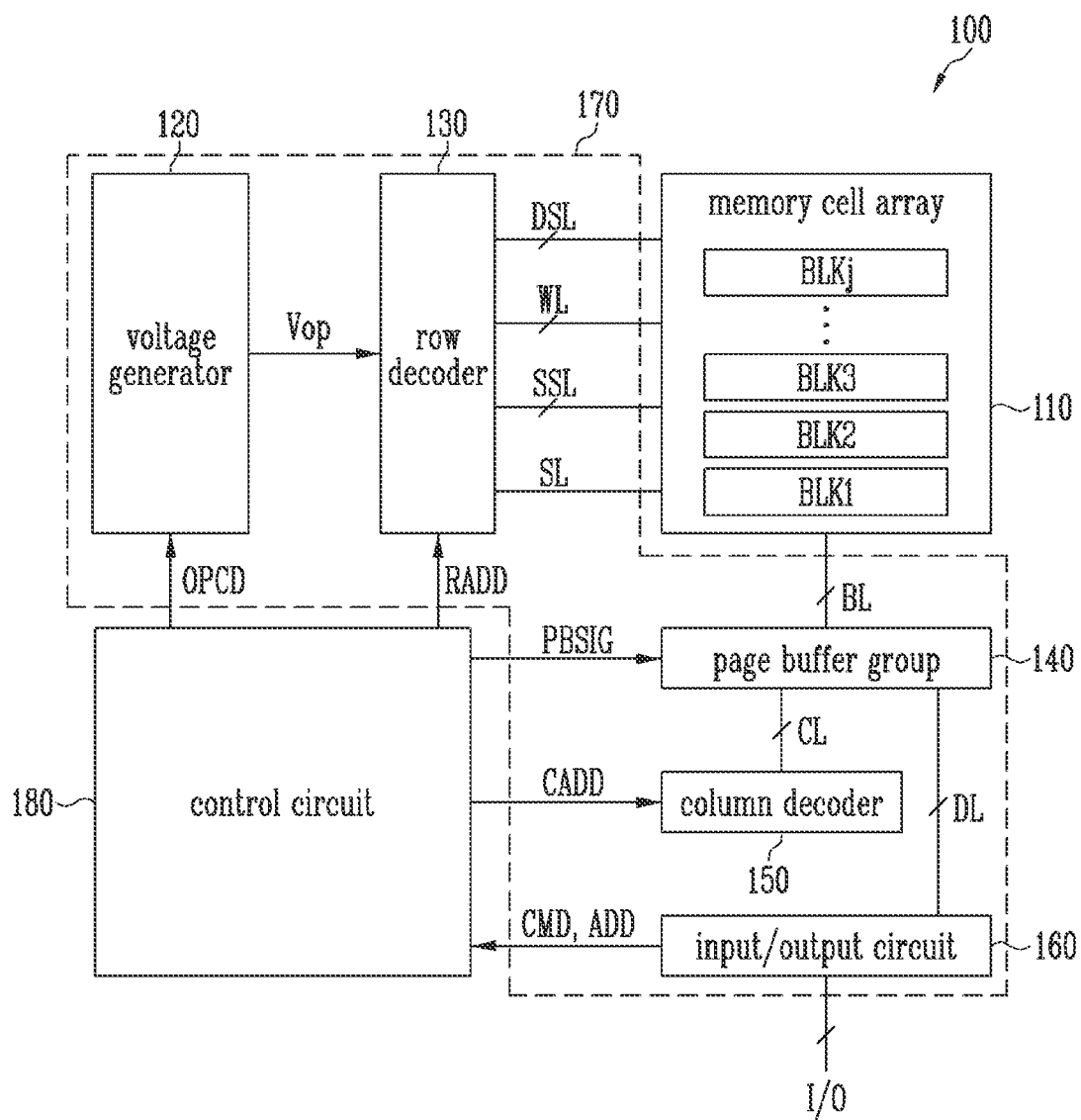
FIG. 1 is a diagram illustrating a memory device.

FIG. 1 is a diagram illustrating a memory device.

Referring to FIG. 1, the memory device 100 may include a memory cell array 110, a peripheral circuit 170, and a control circuit 180.

The memory cell array 110 may include first to jth memory blocks BLK1 to BLKj. The first to jth memory blocks BLK1 to BLKj may be formed in a three-dimensional structure. The first to jth memory blocks BLK1 to BLKj formed in the three-dimensional structure may include memory cells stacked in a vertical direction above a substrate.

The memory cells may store one-bit or two-or-more-bit data according to a program manner. For example, a manner in which one-bit data is stored in one memory cell is referred to as a single-level cell (SLC) manner, and a manner in which two-bit data is stored in one memory cells is referred to as a multi-level cell (MLC) manner. A manner in which three-bit data is stored in one memory cell is referred to as a triple-level cell (TLC) manner, and a manner in which four-bit data is stored in one memory cell is referred to as a quad-level cell (QLC) manner. In addition, five-or-more-bit data may be stored in one memory cell.

The peripheral circuit 170 may be configured to perform a program operation for storing data, a read operation for outputting data stored in the memory cell array 110, and an erase operation for erasing data stored in the memory cell array 110. For example, the peripheral circuit 170 may include a voltage generator 120, a row decoder 130, a page buffer group 140, a column decoder 150, and an input/output circuit 160.

The voltage generator 120 may generate various operating voltages Vop used for a program operation, a read operation, or an erase operation in response to an operation code OPCD. For example, the voltage generator 120 is configured to generate program voltages, pass voltages, turn-on voltages, turn-off voltages, a ground voltage, negative voltages, source voltages, verify voltages, read voltages, erase voltages, a precharge voltage, and the like, in response to the operation code OPCD.

The program voltages are voltages applied to a selected word line among word lines WL in a program operation, and may be used to increase a threshold voltage of memory cells connected to the selected word line.

The pass voltages are voltages applied to unselected word lines among the word lines WL in a program or read operation, and may be used to turn on memory cells connected to the unselected word lines. In accordance with this embodiment, in a read operation, the voltage generator 120 may adjust levels of the pass voltages according to a position of the selected word line.

The turn-on voltages are voltages applied to drain select lines DSL or source select lines SSL, and may be used to turn on drain select transistors or source select transistors. The turn-off voltages are voltages applied to the drain select lines DSL or the source select lines SSL, and may be used to turn off the drain select transistors or the source select transistors.

The ground voltage may be a voltage of 0V, and the negative voltages may be voltages lower than 0V. The source voltages are voltages applied to a source line SL, and may correspond to negative voltages, the ground voltage, or positive voltages.

The verify voltages are voltages for determining a threshold voltage of selected memory cells in a program or erase operation, and may be applied to a selected word line or selected word lines. The read voltages are voltages applied to a selected word line in a read operation, and may be used to determine data stored in memory cells.

The erase voltages are voltages applied to the source line SL in an erase operation, and may be used to decrease a threshold of memory cells. The precharge voltage is a positive voltage for precharging channels of unselected strings in a verify or read operation, and may be supplied to the source line SL.

Because the voltage generator 120 generates the operating voltages Vop in response to the operation code OPCD, the voltage generator 120 may adjust levels of the operating voltages Vop, and adjust times at which the operating voltages Vop are output to the row decoder 130. The voltage generator 120 may set an offset in some voltages among the operating voltages Vop set as default in response to the operation code OPCD. For example, when the offset is set in a step voltage for increasing a program voltage, the voltage generator 120 may increase the program voltage stepwise according to the step voltage to which the set offset is applied. The voltage generator 120 may set the offset in a start program voltage, and generate and output the program voltage in which the offset is set. When the offset is set in an erase operation, the voltage generator 120 may generate and output an erase voltage in which the offset is set.

The row decoder 130 may be connected to the voltage generator 120 through global lines, and be connected to the first to jth memory blocks BLK1 to BLKj through the drain select lines DSL, the word lines WL, the source select lines SSL, and the source line SL. The row decoder 130 may be configured to transmit the operating voltages Vop to the drain select lines DSL, the word lines WL, the source select lines SSL, and the source line SL, which are connected to a selected memory block, according to a row address RADD.

The page buffer group 140 may include page buffers (not shown) commonly connected to the first to jth memory blocks BLK1 to BLKj. For example, each of the page buffers (not shown) may be connected to the first to jth memory blocks BLK1 to BLKj through bit lines BL. The page buffers (not shown) may sense a current or voltage of the bit lines BL in response to page buffer control signals PBSIG. In a program operation, the page buffers included in the page buffer group 140 may apply program allow voltages or a program inhibit voltage to the bit lines BL. For example, the page buffers included in the page buffer group 140 may selectively apply the program allow voltages having various levels to the bit lines BL in response to the page buffer control signals PBSIG, and adjust a time for which the program allow voltages are applied to the bit lines BL. Also, the page buffers may simultaneously adjust a level of the program allow voltages and a time for which the program allow voltages are applied to the bit lines BL. The page buffers may sequentially apply the program allow voltages to the bit lines BL.

The column decoder 150 may be configured to transmit data between the page buffer group 140 and the input/output circuit 160 in response to a column address CADD. For example, the column decoder 150 may be connected to the page buffer group 140 through column lines CL, and apply enable signals to the column lines, thereby transmitting data between the page buffers (not shown) included in the page buffer group 140 and the input/output circuit 160.

The input/output circuit 160 may be configured to receive or output a command CMD, an address ADD, or data through input/output lines I/O. For example, the input/output circuit 160 may transmit, to the control circuit 180, a command CMD and an address ADD, which are received from an external controller, through the input/output lines I/O, and transmit data received from the external controller to the column decoder 150 through the input/output lines I/O. The input/output circuit 160 may output data transferred from the page buffer group 140 to the external controller through the input/output lines I/O, or transfer data received from the external controller to the page buffer group 140 through data lines DL.

The control circuit 180 may include hardware configured to output an operation code OPCD, the row address RADD, the page buffer control signals PBSIG, and the column address CADD in response to the command CMD and the address ADD, and software for executing various algorithms. When the command CMD input to the control circuit 180 is a command corresponding to a program operation, the control circuit 180 may control the peripheral circuit 170 to perform the program operation of a memory block selected by the address ADD by executing a program algorithm. When the command CMD input to the control circuit 180 is a command corresponding to a read operation, the control circuit 180 may control the peripheral circuit 170 to perform the read operation of the memory block by executing a read algorithm and to output read data. When the command CMD input to the control circuit 180 is a command corresponding to an erase operation, the control circuit 180 may control the peripheral circuit 170 to perform the erase operation of the selected memory block by executing an erase algorithm.

The control circuit 180 may count a number of program loops performed in a selected page, and adjust the page buffer control signals PBSIG such that the level or time of the program allow voltages applied to the bit lines BL or such that the level and time of the program allow voltages are adjusted, according to the counted number of program loops.

Figure 2:
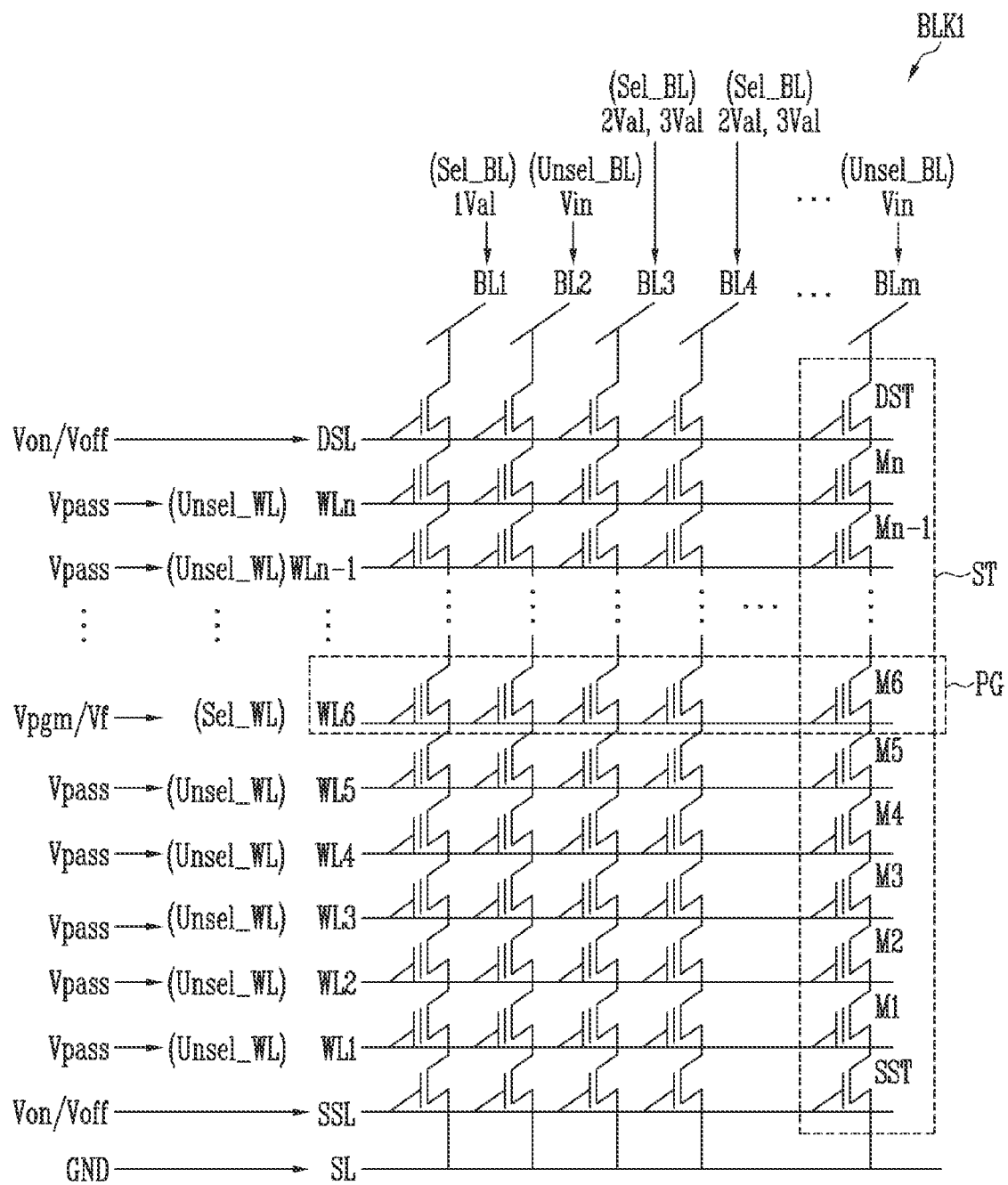
FIG. 2 is a diagram illustrating voltages applied to a selected memory block in a program operation of the selected memory block.

FIG. 2 is a diagram illustrating voltages applied to a selected memory block in a program operation of the selected memory block.

Referring to FIG. 2, the first to jth memory blocks BLK1 to BLKj shown in FIG. 1 are configured identically to one another, and therefore, a case where the first memory block BLK1 among the first to jth memory blocks BLK1 to BLKj is a selected memory block is illustrated as an example.

The first memory block BLK1 includes strings connected between first to mth bit lines BL1 to BLm and a source line SL. A string ST connected to the mth bit line BLm will be described as an example. The string ST may include a source select transistor SST, first to nth memory cells M1 to Mn, and a drain select transistor DST. The first memory block BLK1 shown in FIG. 2 is a diagram schematically illustrating a structure of the memory block, and therefore, the number of the source select transistor SST, the first to nth memory cells M1 to Mn, and the drain select transistor DST, which are included in the string ST, may be changed according to a memory device. Although not shown in the drawing, dummy cells for improving electrical characteristics of memory cells may be further included in the strings ST. The dummy cells may store dummy data instead of normal data.

Gates of source select transistors SST included in different strings ST may be connected to a source select line SSL, gates of the first to nth memory cells M1 to Mn included in different strings ST may be connected to first to nth word lines WL1 to WLn, and gate of drain select transistors DST included in the different strings ST may be connected to a drain select line DSL.

Memory cells formed in the same layer among the first to nth memory cells M1 to Mn may be connected to the same word line. For example, first memory cells M1 included in different strings ST may be commonly connected to a first word line WL1, and nth memory cells Mn included in the different strings ST may be commonly connected to an nth word line WLn. A group of memory cells connected to the same word line becomes a page PG. A program or read operation may be performed in units of pages PG.

A program operation will be described as an example. A program voltage Vpgm or a verify voltage Vf may be applied to a selected word line Sel_WL connected to a selected page, and a pass voltage Vpass may be applied to unselected word lines Unsel_WL connected to unselected pages. A turn-on voltage Von or a turn-off voltage Voff may be applied to the drain select line DSL and the source select line SSL. A ground voltage GND may be applied to the source line SL, but a positive voltage may be applied to the source line SL. The first to mth bit lines BL1 to BLm may be divided into selected bit lines Sel_BL and unselected bit lines Unsel_BL according to data stored in the page buffers. The selected bit lines Sel_BL are bit lines connected to strings including program target memory cells. The unselected bit lines Unsel_BL are bit lines connected to strings including memory cells to be maintained in an erase state or memory cells which are completely programmed. A first program allow voltage 1Val may be applied to some of the selected bit lines Sel_BL. Second and third program allow voltages 2Val and 3Val may be sequentially applied to another some of the selected bit lines Sel_BL. A program inhibit voltage Vin may be applied to the unselected bit lines Unsel_BL.

The first program allow voltage 1Val is a voltage for allowing a threshold voltage of a memory cell to be rapidly increased, and may be set to 0V. The program inhibit voltage Vin is a voltage for allowing the threshold voltage of the memory cell not to be increased, and may be set to a positive voltage higher than 0V. Each of the second and third program allow voltages 2Val and 3Val is a voltage for allowing the threshold voltage of the memory cell to be slowly increased, and may be set to a voltage which is higher than the first program allow voltage 1Val and is lower than the program inhibit voltage Vin. The third program allow voltage 3Val may be set higher than the second program allow voltage 2Val.

In the program operation of the selected page, a plurality of program loops may be performed until a threshold voltage of selected memory cells included in the selected page reaches a target level. Each of the program loops may include a program voltage apply step and a verify step. The first to third program allow voltages 1Val to 3Val and the program inhibit voltage Vin may be applied to the first to mth bit lines BL1 to BLm in the program voltage apply step.

Figures 3, 4:
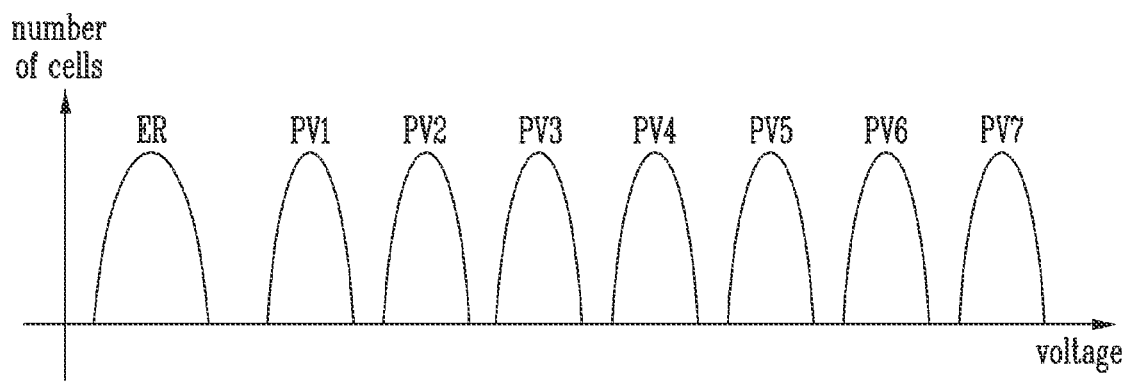
FIG. 3 is a diagram illustrating a threshold voltage distribution of memory cells.
FIG. 4 is a diagram illustrating program loops performed in a selected page.

FIG. 3 is a diagram illustrating a threshold voltage distribution of memory cells.

Referring to FIG. 3, a threshold voltage distribution of memory cells programmed in a triple-level cell manner is illustrated as an example, but this embodiment is not limited to the triple-level cell manner.

In a program operation, memory cells included in a selected page may be maintained in an erase state ER, or be programmed to any one state among first to seventh program states PV1 to PV7. A program voltage is applied to a selected word line connected to the selected page, and therefore, program allow voltages or a program inhibit voltage may be applied to bit lines such that memory cells having different target levels have different threshold voltages.

The memory cells included in the selected page may be programmed to the first to seventh program states PV1 to PV7 by a plurality of program loops. The program loops will be described in detail as follows.

FIG. 4 is a diagram illustrating program loops performed in a selected page.

Referring to FIG. 4, first to nth program loops 1PL to nPL may be performed until memory cells included in a selected page have a threshold voltage of a target level. Here, n is a positive integer. The first program loop 1PL may be a loop performed first in the selected page, and the nth program loop nPL may be a loop performed last in the selected page. Therefore, n may be changed according to a program speed of the memory cells included in the selected page.

Each of the first to nth program loops 1PL to nPL may include a program voltage apply step PGM and a verify step VF. The program voltage apply step PGM is a step in which a program voltage is applied to a selected word line. Memory cells connected to the selected word line may be programmed to different program states, and therefore, program allow voltages or a program inhibit voltage may be applied to bit lines according to a target level. For example, the program allow voltages may be applied to selected bit lines connected to selected memory cells, and the program inhibit voltage may be applied to unselected bit lines connected to unselected memory cells. The program allow voltage may be set to various levels. For example, as a voltage difference between the target level and a threshold voltage becomes large, the program allow voltage may be set lower. As the voltage difference between the target level and the threshold voltage becomes smaller, the program allow voltage may be set higher. In this embodiment, when the voltage difference between the target level and the threshold voltage decreases, a program allow voltage set low may be applied to the selected bit lines, and a program allow voltage set high may be applied to the selected bit lines after a certain time elapses. That is, the program allow voltages applied to the selected bit lines may be increased stepwise.

Figure 5A:
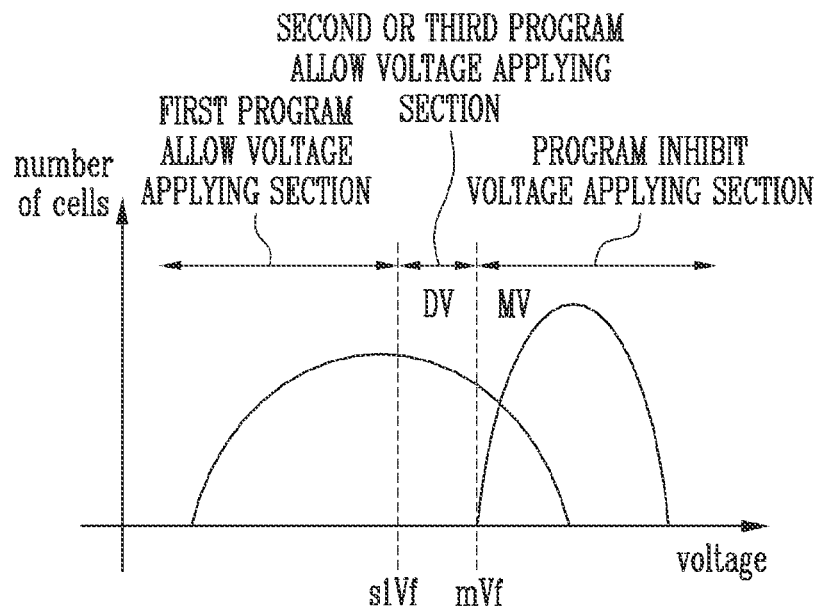
FIGS. 5A and 5B are diagrams illustrating voltages applied to bit lines in a program operation.
Figure 5B:
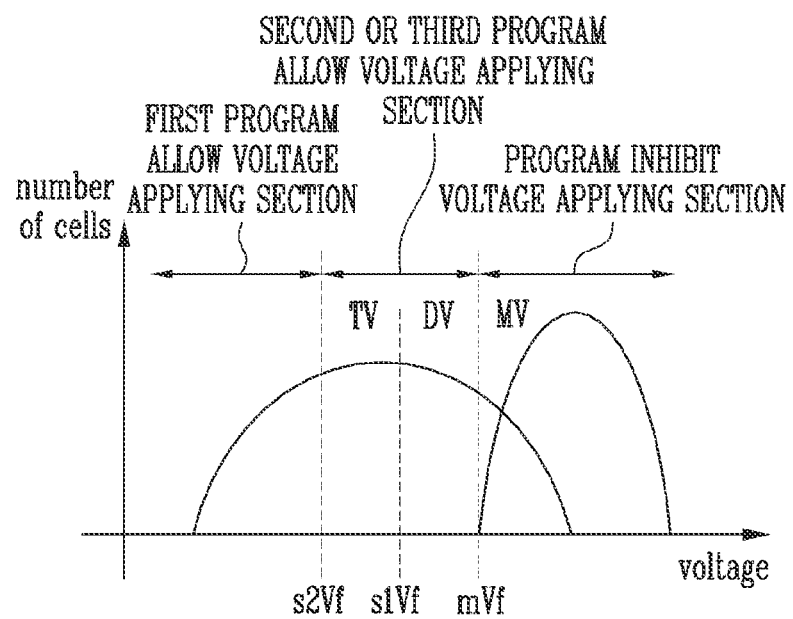

FIGS. 5A and 5B are diagrams illustrating voltages applied to bit lines in a program operation.

Referring to FIG. 5A, in a verify step of the program operation, a double verify operation DV may be performed. A verify operation using a main verify voltage mVf and a verify operation using a first sub-verify voltage s1Vf may be performed in the double verify operation DV. The main verify voltage mVf may be set to a voltage corresponding to a target level, and the first sub-verify voltage s1Vf may be set to a voltage lower than the main verify voltage mVf. Therefore, after the double verify operation DV using the first sub-verify voltage s1Vf is performed, a main verify operation MV using the main verify voltage mVf may be performed.

A first program allow voltage which is lowest among program allow voltages may be applied to bit lines of memory cells having a threshold voltage lower than the first sub-verify voltage s1Vf. A second or third program allow voltage higher than the first program allow voltage may be applied to bit lines of memory cells having a threshold voltage between the first sub-verify voltage s1Vf and the main verify voltage mVf. The third program allow voltage may be set to a voltage lower than a program inhibit voltage. The second program allow voltage may be set to a voltage between the first program allow voltage and the third program allow voltage. The first program allow voltage may be set to 0V. Alternatively, the first program allow voltage may be set to a negative voltage lower than 0V. The program inhibit voltage may be applied to bit lines of memory cells having a threshold voltage higher than the main verify voltage mVf.

The first program allow voltage may be used to rapidly increase a threshold voltage of memory cells. The second and third program allow voltages may be used to slowly increase a threshold voltage of memory cells. The program inhibit voltage may be used to maintain a threshold voltage of memory cells. In a section in which the second or third program allow voltage is applied, after the second program allow voltage is applied to bit lines, the third program allow voltage may be applied to the bit lines. A level of the third program allow voltage and a time for which the third program allow voltage is applied may be changed according to a program loop.

Referring to FIG. 5B, in a verify step of the program operation, a double verify operation DV and a triple verify operation TV may be performed. A verify operation using a main verify voltage mVf and a verify operation using a first sub-verify voltage s1Vf may be performed in the double verify operation DV. A verify operation using a second sub-verify voltage s2Vf may be performed in the triple verify operation TV. The main verify voltage mVf may be set to a voltage corresponding to a target level, the first sub-verify voltage s1Vf may be set to a voltage lower than the main verify voltage mVf, and the second sub-verify voltage s2Vf may be set to a voltage lower than the first sub-verify voltage s1Vf. Therefore, after the triple verify operation TV using the second sub-verify voltage s2Vf is performed, the double verify operation DV using the first sub-verify voltage s1Vf may be performed. After the double verify operation DV is performed, a main verify operation MV using the main verify voltage mVf may be performed.

A first program allow voltage which is lowest among program allow voltages may be applied to bit lines of memory cells having a threshold voltage lower than the second sub-verify voltage s2Vf. A second or third program allow voltage higher than the first program allow voltage may be applied to bit lines of memory cells having a threshold voltage between the second sub-verify voltage s2Vf and the first sub-verify voltage s1Vf. The third program allow voltage may be applied to bit lines of memory cells having a threshold voltage between the first sub-verify voltage s1Vf and the main verify voltage mVf. The third program allow voltage may be set to a voltage lower than a program inhibit voltage. The second program allow voltage may be set to a voltage between the first program allow voltage and the third program allow voltage. The first program allow voltage may be set to 0V. Alternatively, the first program allow voltage may be set to a negative voltage lower than 0V. The program inhibit voltage may be applied to bit lines of memory cells having a threshold voltage higher than the main verify voltage mVf.

The first program allow voltage may be used to rapidly increase a threshold voltage of memory cells. The second and third program allow voltages may be used to slowly increase a threshold voltage of memory cells. The program inhibit voltage may be used to maintain a threshold voltage of the memory cells. In a section in which the second or third program allow voltage is applied, after the second program allow voltage is applied to bit lines, the third program allow voltage may be applied to the bit lines. A level of the third program allow voltage and a time for which the third program allow voltage is applied may be changed according to a program loop.

Figure 6:
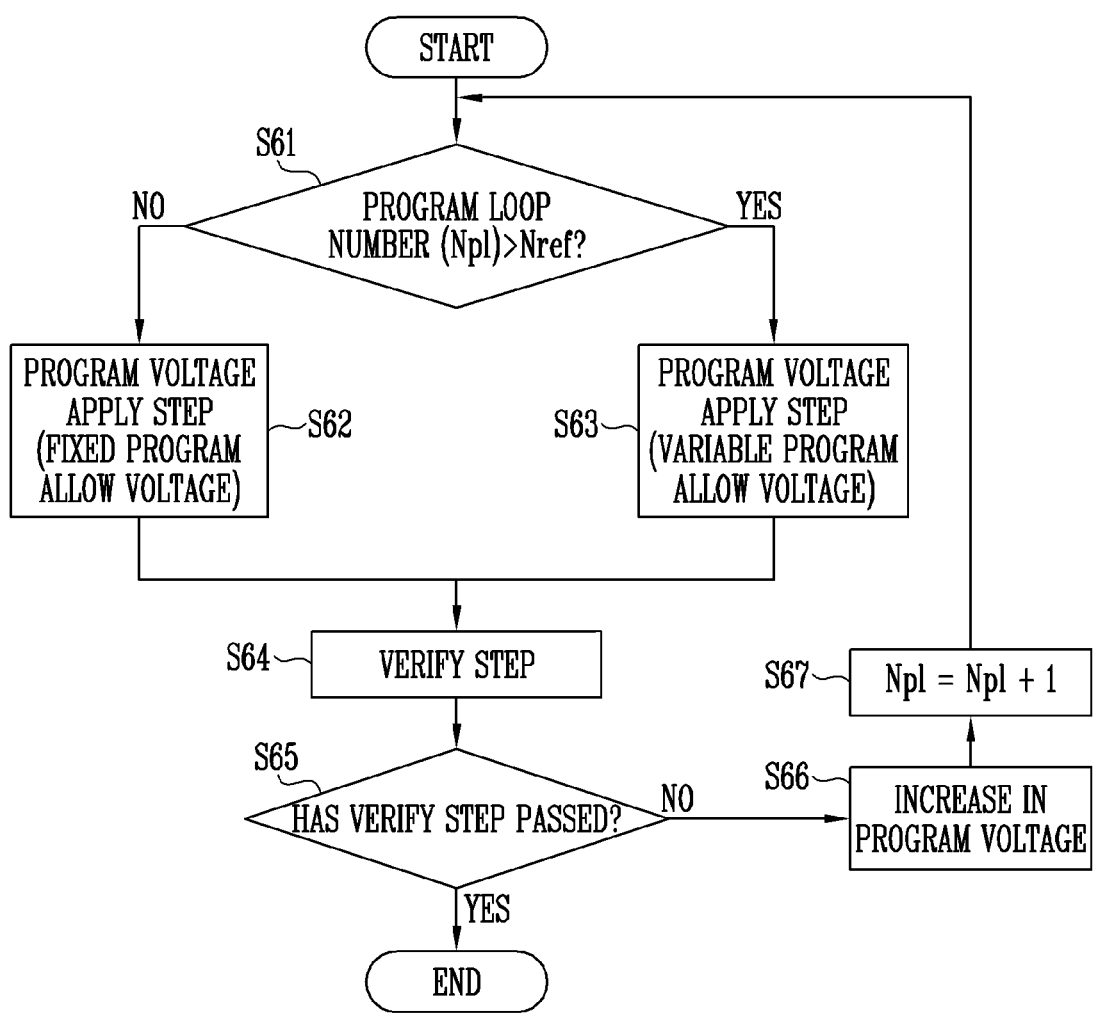
FIG. 6 is a flowchart illustrating a program operation in accordance with an embodiment of the present disclosure.

FIG. 6 is a flowchart illustrating a program operation in accordance with an embodiment of the present disclosure.

Referring to FIG. 6, when the program operation is started, the control circuit (180 shown in FIG. 1) may compare a program loop number Npl of a selected page and a reference number Nref with each other (S61). The reference number Nref is a number stored in the control circuit 180, and may be pre-stored in the memory device. The program loop number Npl is a number of a current program loop of the program loops to be performed in the selected page, and its initial value may be set to '1.' For example, when a first program loop is performed in the selected page, the program loop number Npl becomes 1.

When the program loop number Np1 is equal to or smaller than the reference number Nref ('NO' in the step S61), a program voltage apply step (S62) may be performed in a state in which a fixed program allow voltage is applied to bit lines. The fixed program allow voltage is a voltage applied to selected bit lines, and may be maintained in a constant level while the program voltage apply step (S62) is performed. While the fixed program allow voltage is applied to the bit lines, a program voltage may be applied to a selected word line, and a pass voltage may be applied to unselected word lines.

In the step S61, when the program loop number Npl is greater than the reference number Nref ('YES'), a program voltage apply step (S63) may be performed in a state in which a variable program allow voltage is applied to bit lines. The variable program allow voltage is a voltage applied to selected bit lines. The variable program allow voltage may be increased stepwise while the program voltage apply step (S63) is performed, and a time for which a level of the variable program allow voltage is increased stepwise may also be varied. While the variable program allow voltage is applied to the bit lines, the program voltage may be applied to a selected word line, and the pass voltage may be applied to unselected word lines.

After the step S62 or the step S63 is performed, a verify step (S64) for determining a threshold voltage of selected memory cells may be performed. In the verify step (S64), the bit lines may be precharged to a positive voltage, a verify voltage may be applied to the selected word line, and the pass voltage may be applied to the unselected word lines. A voltage or current of the precharge bit lines may be maintained or decreased according to the threshold voltage of the selected memory cells, and page buffers may sense the voltage or current of the bit lines.

According to a sensing result of the step S64, the control circuit may determine whether the verify step has passed (S65). When it is determined that memory cells for which the threshold voltage is lower than a target voltage among the selected memory cells according to the sensing result, the control circuit may determine the verify step as 'fail' (NO). When the verify step is determined as 'fail,' for the purpose of a next program loop, the program voltage is set to increase by a step voltage (S66), and the program loop number Npl increased by 1 (S67). When the program loop number Npl is updated, the step S61 may be again performed. In this manner, the steps S61 to S67 may be repeated until the verify step passes (YES).

In the step S65, when it is determined that the threshold voltage of the selected memory cells becomes higher than the target voltage, the control circuit may determine the verify step as 'pass' (YES), and the program operation of the selected page may be ended.

The voltages applied to the bit lines in the above-described steps S62 and S63 will be described in detail as follows.

Figure 7:
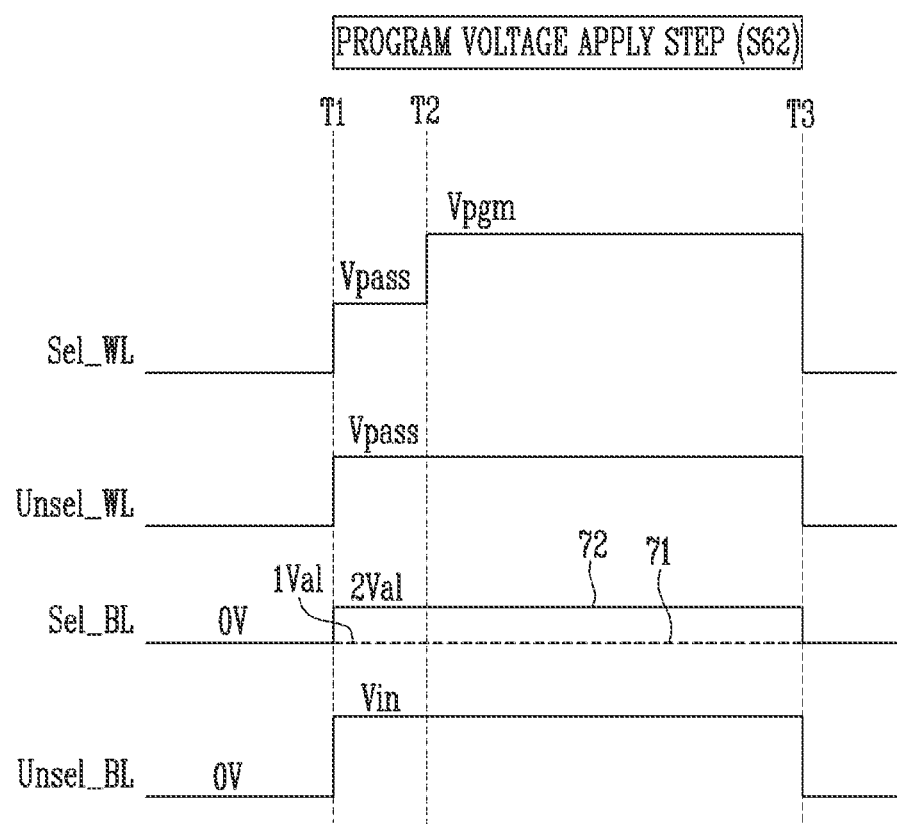
FIG. 7 is a diagram illustrating a program voltage apply step using a fixed program allow voltage.

FIG. 7 is a diagram illustrating a program voltage apply step using a fixed program allow voltage.

Referring to FIGS. 6 and 7, because the step S62 is a step in which the program loop number Npl of the selected page is smaller than the reference number Nref, a threshold voltage of the memory cells included in the selected page may be lower than a threshold voltage of the memory cells included in the selected page in the step S63. Therefore, while the step S62 is performed (T1 to T3), each of first and second program allow voltages 1Val and 2Val is maintained at a constant level. Each section of the step S62 will be described in detail as follows.

When the step S62 is started (T1), a pass voltage Vpass may be applied to a selected word line Sel_WL and unselected word lines Unsel_WL. The pass voltage Vpass is a voltage for forming a channel in strings, and may be set to a positive voltage.

The first program allow voltage 1Val or the second program allow voltage 2Val may be applied to selected bit lines Sel_BL, and a program inhibit voltage Vin may be applied to unselected bit lines Unsel_BL. The first program allow voltage 1Val is a voltage for rapidly increasing a threshold voltage of memory cells, and may be set to 0V. Therefore, the first program allow voltage 1Val may be applied to bit lines 71 connected to memory cells for which the threshold voltage is relatively low among the selected bit line Sel_BL. The second program allow voltage 2Val is a voltage for slowly increasing a threshold voltage of memory cells, and may be set to a voltage higher than the first program allow voltage 1Val. Therefore, the second program allow voltage 2Val may be applied to bit lines 72 connected to memory cells for which the threshold voltage is relatively high among the selected bit lines Sel_BL.

When a certain time elapses after the pass voltage Vpass is applied to the selected word line Sel_WL (T2), a program voltage Vpgm may be applied to the selected word line Sel_WL. The program voltage Vpgm is a voltage for increasing a threshold voltage of memory cells, and may be set to a positive voltage higher than the pass voltage Vpass.

When the program voltage Vpgm is applied to the selected word line Sel_WL for a certain time (T3), the word lines Sel_WL and Unsel_WL and the bit lines Sel_BL and Unsel_BL may be discharged for the purpose of the verify step.

Figure 8:
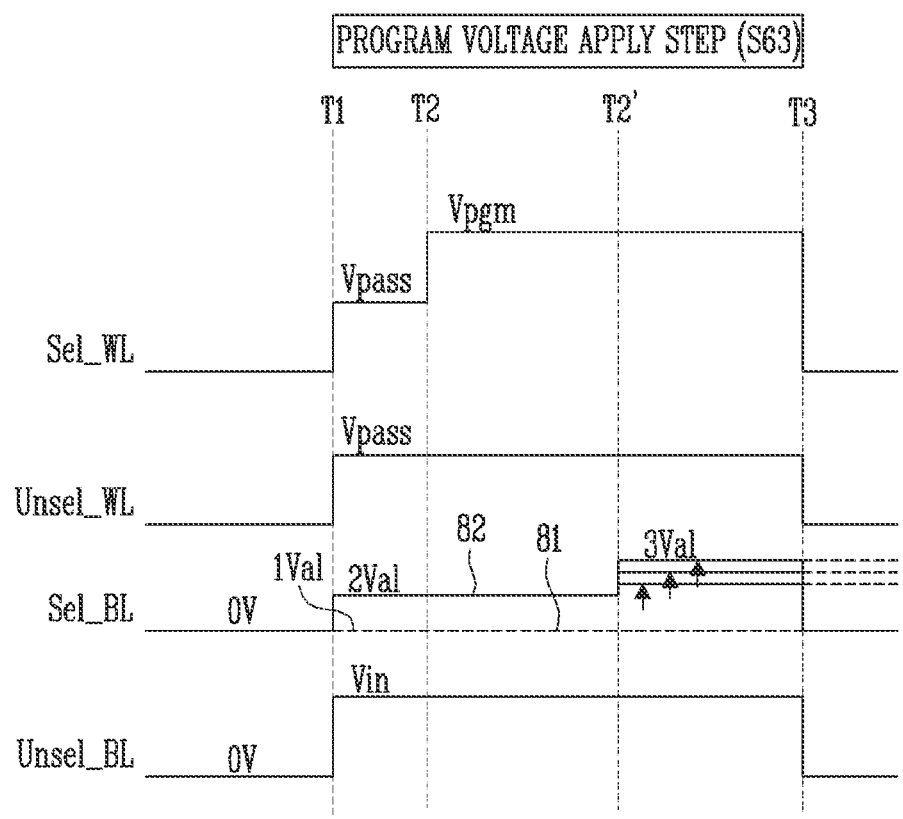
FIG. 8 is a diagram illustrating a program voltage apply step using a variable program allow voltage in accordance with a first embodiment of the present disclosure.

FIG. 8 is a diagram illustrating a program voltage apply step using a variable program allow voltage in accordance with a first embodiment of the present disclosure.

Referring to FIGS. 6 and 8, because the step S63 is a step in which the program loop number Npl of the selected page is greater than the reference number Nref, the threshold voltage of the memory cells included in the selected page may be higher than the threshold voltage of the memory cells included in the selected page in the step S62. Therefore, during the step S63 is performed (T1 to T3), a program allow voltage applied to some 82 of the selected bit lines Sel_BL may be increased stepwise. Each section of the step S63 will be described in detail as follows.

When the step S63 is started (T1), a pass voltage Vpass may be applied to the selected word line Sel_WL and the unselected word lines Unsel_WL. The pass voltage Vpass is a voltage for forming a channel in strings, and may be set to a positive voltage.

A first program allow voltage 1Val or a second program allow voltage 2Val may be applied to the selected bit lines Sel_BL, and a program inhibit voltage Vin may be applied to the unselected bit lines Unsel_BL. The first program allow voltage 1Val is a voltage for rapidly increasing a threshold voltage of memory cells, and may be set to 0V. Therefore, the first program allow voltage 1Val may be applied to bit lines 81 connected to memory cells for which the threshold voltage is relatively low among the selected bit lines Sel_BL. The first program allow voltage 1Val may be maintained at a constant level while the step S63 is performed. The second program allow voltage 2Val is a voltage for slowly increasing a threshold voltage of memory cells, and may be set to a voltage higher than the first program allow voltage 1Val. Therefore, the second program allow voltage 2Val may be applied to bit lines 82 connected to memory cells for which the threshold voltage is relatively high among the selected bit lines Sel_BL.

When a certain time elapses after the pass voltage Vpass is applied to the selected word line Sel_WL, a program voltage Vpgm may be applied to the selected word line Sel_WL. The program voltage Vpgm is a voltage for increasing a threshold voltage of memory cells, and may be set to a positive voltage higher than the pass voltage Vpass.

While the program voltage Vpgm is applied to the selected word line Sel_WL (T2 to T3), a third program allow voltage 3Val higher than the second program allow voltage 2Val may be applied to the bit lines 82 connected to the memory cells for which the threshold voltage is relatively high among the selected bit lines Sel_BL. For example, when the program voltage Vpgm is applied to the selected word line Sel_WL for a certain time (T2'), the third program allow voltage 3Val higher than the second program allow voltage 2Val may be applied to the selected bit lines Sel_BL to which the second program allow voltage 2Val is applied. A level of the third program allow voltage 3Val may be increased as the program loop number Npl increases.

When the program voltage Vpgm is applied to the selected word line Sel_WL for a certain time (T3), the word lines Sel_WL and Unsel_WL and the bit lines Sel_BL and Unsel_BL may be discharged for the purpose of the verify step.

Figure 9:
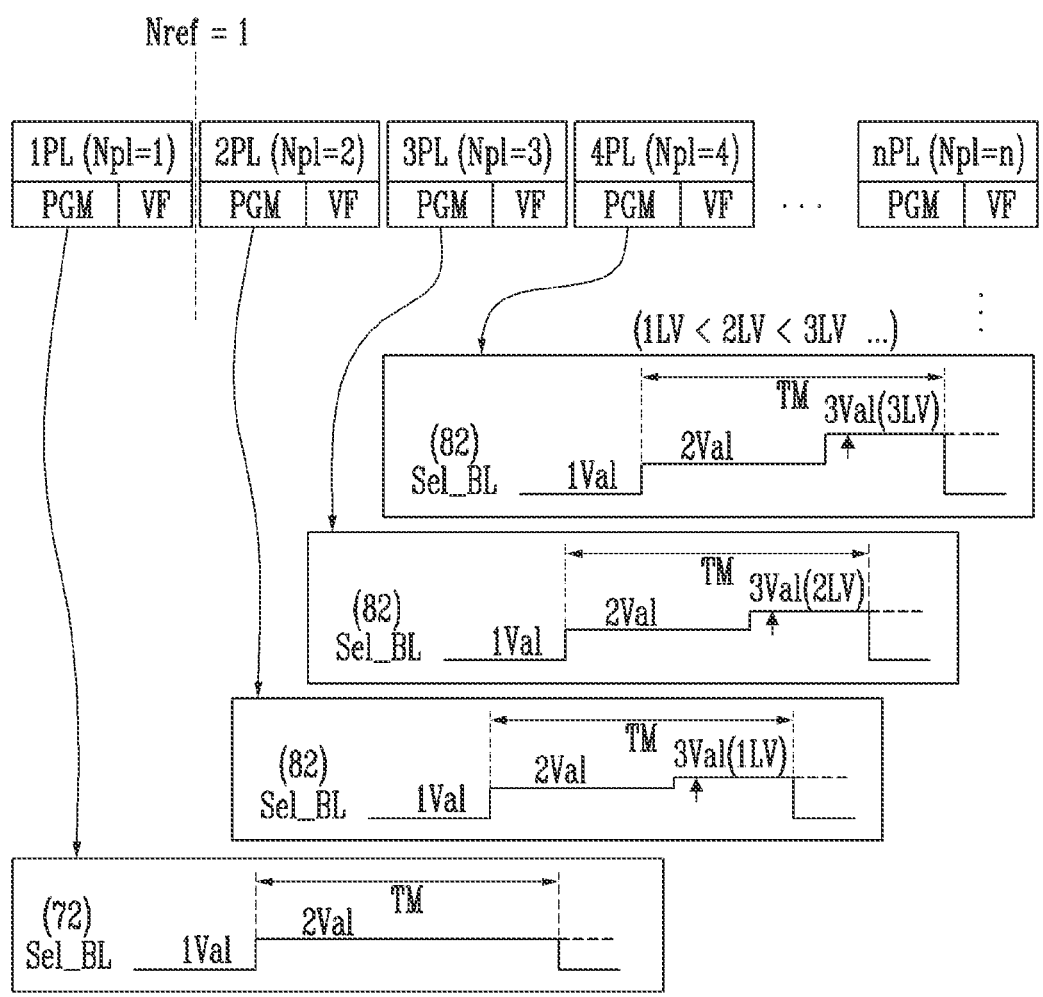
FIG. 9 is a diagram illustrating voltages applied to the bit lines in accordance with the first embodiment of the present disclosure.

FIG. 9 is a diagram illustrating voltages applied to the bit lines in accordance with the first embodiment of the present disclosure.

Referring to FIG. 9, when the program loop number Npl is equal to or smaller than the reference number Nref, the second program allow voltage 2Val may be constantly applied to the bit lines (72 shown in FIG. 7) connected to the memory cells for which the threshold voltage is relatively high among the selected bit lines Sel_BL. When the program loop number Npl is greater than the reference number Nref, the second program allow voltage 2Val and the third program allow voltage 3Val may be sequentially applied to the bit lines (82 shown in FIG. 8) connected to the memory cells for which the threshold voltage is relatively high among the selected bit lines Sel_BL. The bit lines 72 or 82 to which the second or third program allow voltage 2Val or 3Val is applied are selected bit lines connected to memory cells for which the threshold voltage is lower than a target voltage and is higher than a sub-verify voltage.

When the program loop number Npl becomes greater than the reference number Nref, the second program allow voltage 2Val may be applied to the bit lines 82. When the second program allow voltage 2Val is applied for a certain time, the third program allow voltage 3Val higher than the second program allow voltage 2Val may be applied to the same bit lines 82. A time TM for which the second program allow voltage 2Val is applied to the bit lines 72 when the program loop number Npl is smaller than the reference number Nref may be equal to a time TM for which the second and third program allow voltages 2Val and 3Val are applied to the bit lines 82 when the program loop number Npl is greater than the reference number Nref. When assuming that the reference number Nref is '1,' the second program allow voltage 2Val may be constantly applied to the bit lines (72 shown in FIG. 7) connected to the memory cells for which the threshold voltage is relatively high among the selected bit lines Sel_BL in the first program loop 1PL in which the program loop number Npl is '1.' When assuming that the reference number Nref is '1,' the second program allow voltage 2Val and the third program allow voltage 3Val may be sequentially applied to the bit lines (82 shown in FIG. 8) connected to the memory cells for which the threshold voltage is relatively high among the selected bit lines Sel_BL in the second to nth program loops 2PL to nPL in which the program loop number Npl is '2' or more.

When the program loop number Npl is greater than the reference number Nref, the level of the third program allow voltage 3Val applied to the bit lines 82 may be changed according to the program loop number Npl. The level of the third program allow voltage 3Val may be set higher as the program loop number Npl increases. For example, when the program loop number Npl is '2,' the third program allow voltage 3Val may be set to a first level 1LV. The first level 1LV is higher than a level of the second program allow voltage 2Val. When the program loop number Npl is '3,' the third program allow voltage 3Val may be set to a second level 2LV higher than the first level 1LV. When the program loop number Npl is '4,' the third program allow voltage 3Val may be set to a third level 3LV higher than the second level 2LV. In this manner, while the program loop number Npl increases up to 'n,' the level of the third program allow voltage 3Val may be increased stepwise.

Figure 10:
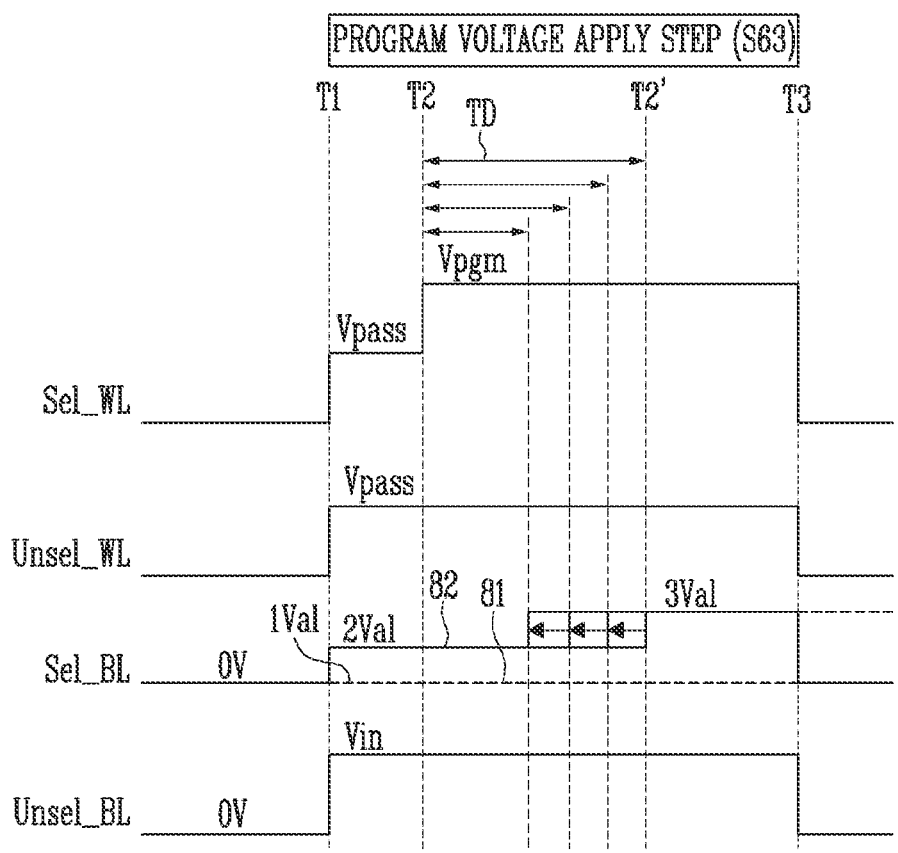
FIG. 10 is a diagram illustrating a program voltage apply step using a variable program allow voltage in accordance with a second embodiment of the present disclosure.

FIG. 10 is a diagram illustrating a program voltage apply step using a variable program allow voltage in accordance with a second embodiment of the present disclosure.

Referring to FIGS. 6 and 10, because the step S63 is a step in which the program loop number Npl of the selected page is greater than the reference number Nref, the threshold voltage of the memory cells included in the selected page may be higher than the threshold voltage of the memory cells included in the selected page in the step S62. Therefore, while the step S63 is performed (T1 to T3), a time at which the third program allow voltage 3Val is applied to some bit lines 82 among the selected bit lines Sel_BL is applied may become earlier stepwise. Each section of the step S63 will be described in detail as follows.

When the step S63 is started (T1), a pass voltage Vpass may be applied to the selected word line Sel_WL and the unselected word lines Unsel_WL. The pass voltage Vpass is a voltage for forming a channel in strings, and may be set to a positive voltage.

A first program allow voltage 1Val or a second program allow voltage 2Val may be applied to the selected bit lines Sel_BL, and a program inhibit voltage Vin may be applied to the unselected bit lines Unsel_BL. The first program allow voltage 1Val is a voltage for rapidly increasing a threshold voltage of memory cells, and may be set to 0V. Therefore, the first program allow voltage 1Val may be applied to bit lines 81 connected to memory cells for which the threshold voltage is relatively low among the selected bit lines Sel_BL. The first program allow voltage 1Val may be maintained at a constant level while the step S63 is performed. The second program allow voltage 2Val is a voltage for slowly increasing a threshold voltage of memory cells, and may be set to a voltage higher than the first program allow voltage 1Val. Therefore, the second program allow voltage 2Val may be applied to bit lines 82 connected to memory cells for which the threshold voltage is relatively high among the selected bit lines Sel_BL.

When a certain time elapses after the pass voltage Vpass is applied to the selected word line Sel_WL, a program voltage Vpgm may be applied to the selected word line Sel_WL. The program voltage Vpgm is a voltage for increasing a threshold voltage of memory cells, and may be set to a positive voltage higher than the pass voltage Vpass.

While the program voltage Vpgm is applied to the selected word line Sel_WL (T2 to T3), a third program allow voltage 3Val higher than the second program allow voltage 2Val may be applied to the bit lines 82 connected to the memory cells for which the threshold voltage is relatively high among the selected bit lines Sel_BL. For example, when the program voltage Vpgm is applied to the selected word line Sel_WL for a certain time (T2'), the third program allow voltage 3Val higher than the second program allow voltage 2Val may be applied to the selected bit lines Sel_BL to which the second program allow voltage 2Val is applied. The time T2' at which the third program allow voltage 3Val is applied may become earlier as the program loop number Npl increases. For example, as the program loop number Npl increases, a time TD for which the second program allow voltage 2Val applied to the selected bit lines Sel_BL is maintained may be shortened stepwise.

When the program voltage Vpgm is applied to the selected word line Sel_WL for a certain time (T3), the word lines Sel_WL and Unsel_WL and the bit lines Sel_BL and Unsel_BL may be discharged for the purpose of the verify step.

Figure 11:
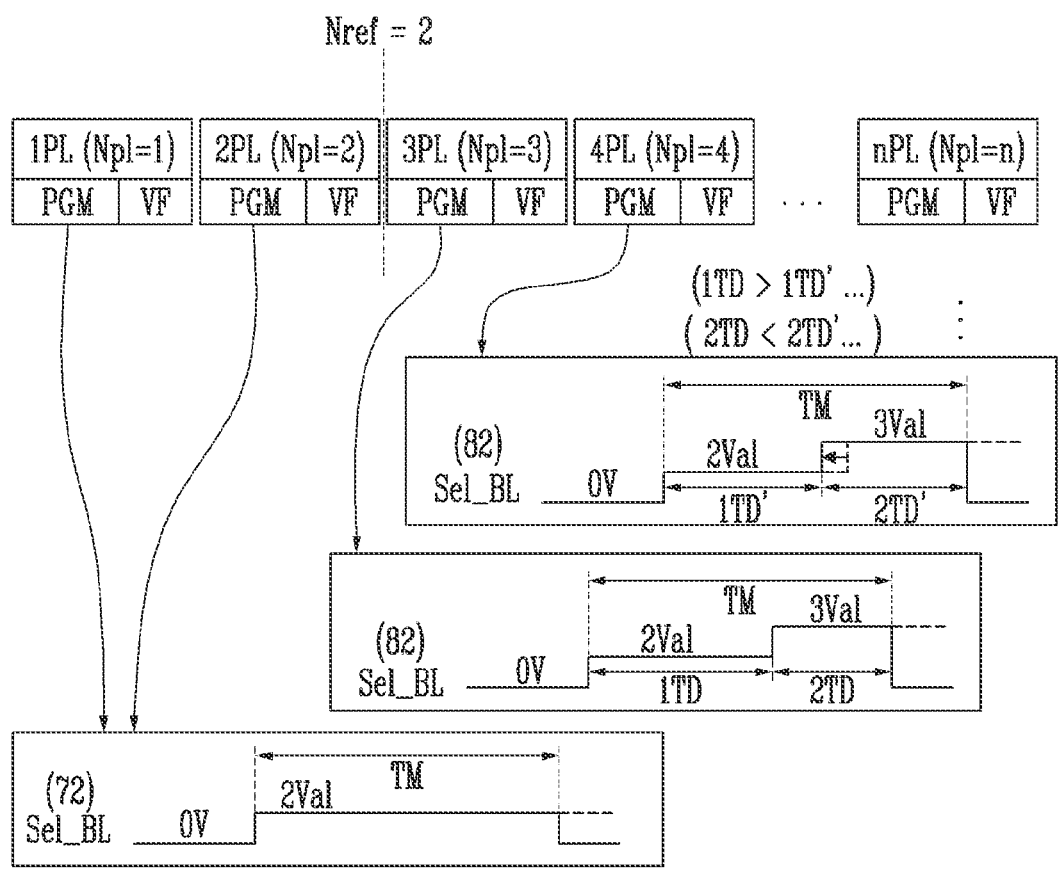
FIG. 11 is a diagram illustrating voltages applied to the bit lines in accordance with the second embodiment of the present disclosure.

FIG. 11 is a diagram illustrating voltages applied to the bit lines in accordance with the second embodiment of the present disclosure.

Referring to FIG. 11, when the program loop number Npl is equal to or smaller than the reference number Nref, the second program allow voltage 2Val may be constantly applied to the bit lines (72 shown in FIG. 7) connected to the memory cells for which the threshold voltage is relatively high among the selected bit lines Sel_BL. When the program loop number Npl is greater than the reference number Nref, the second program allow voltage 2Val and the third program allow voltage 3Val may be sequentially applied to the bit lines (82 shown in FIG. 8) connected to the memory cells for which the threshold voltage is relatively high among the selected bit lines Sel_BL. The bit lines 72 or 82 to which the second or third program allow voltage 2Val or 3Val is applied are selected bit lines connected to memory cells for which the threshold voltage is lower than a target voltage and is higher than a sub-verify voltage.

When the program loop number Npl becomes greater than the reference number Nref, the second program allow voltage 2Val may be applied to the bit lines 82. When the second program allow voltage 2Val is applied for a certain time, the third program allow voltage 3Val higher than the second program allow voltage 2Val may be applied to the same bit lines 82. A time TM for which the second program allow voltage 2Val is applied to the bit lines 72 when the program loop number Npl is smaller than the reference number Nref may be equal to a total time TM of a time 1TD for which the second program allow voltage 2Val is applied to the bit lines 82 when the program loop number Npl is greater than the reference number Nref and a time 2TD for which the third program allow voltage 3Val is applied to the bit lines 82 when the program loop number Npl is greater than the reference number Nref.

When assuming that the reference number Nref is '2,' the second program allow voltage 2Val may be constantly applied to the bit lines (72 shown in FIG. 7) connected to the memory cells for which the threshold voltage is relatively high among the selected bit lines Sel_BL in the first program loop 1PL in which the program loop number Npl is '1.' The second program allow voltage 2Val may be constantly applied to the bit lines (72 shown in FIG. 7) connected to the memory cells for which the threshold voltage is relatively high among the selected bit lines Sel_BL in the second program loop 2PL in which the program loop number Npl is '2.' When the reference number Nref is set to '2,' the second program allow voltage 2Val and the third program allow voltage 3Val may be sequentially applied to the bit lines (82 shown in FIG. 8) connected to the memory cells for which the threshold voltage is relatively high among the selected bit lines Sel_BL in the third to nth program loops 3PL to nPL in which the program loop number Npl is '3' or more.

When the program loop number Npl is greater than the reference number Nref, a time 2TD, 2TD', . . . for which the third program allow voltage 3Val is applied to the bit lines 82 may be changed according to the program loop number Npl. The time 2TD, 2TD', . . . for which the third program allow voltage 3Val is applied may be set longer as the program loop number Npl increases. For example, when the program loop number Npl is '3,' the second program allow voltage 2Val may be applied for a first time 1TD, and the third program allow voltage 3Val may be applied for a second time 2TD. A total time TM of the first and second times 1TD and 2TD may be constant regardless of the number of program loops. When the program loop number Npl is '4,' the second program allow voltage 2Val may be applied to a first time 1TD' shorter than 1TD, and the third program allow voltage 3Val may be applied for a second time 2TD' longer than 2TD. A total time TM of the first and second times 1TD' and 2TD' may be constant regardless of the number of program loops. In this manner, while the program loop number Npl increases up to 'n,' the time for which the second program allow voltage 2Val is applied may be shortened stepwise, and the time for which the third program allow voltage 3Val is applied may be lengthened stepwise.

In addition, the above-described first embodiment and the above-described second embodiment may be combined together. For example, as the program loop number Npl increases, the level of the third program allow voltage 3Val may be increased stepwise, and a time at which the third program allow voltage 3Val is applied to the selected word line may be set to become earlier stepwise so that the time interval for which the third program allow voltage 3Val is applied becomes longer stepwise.

Figure 12:
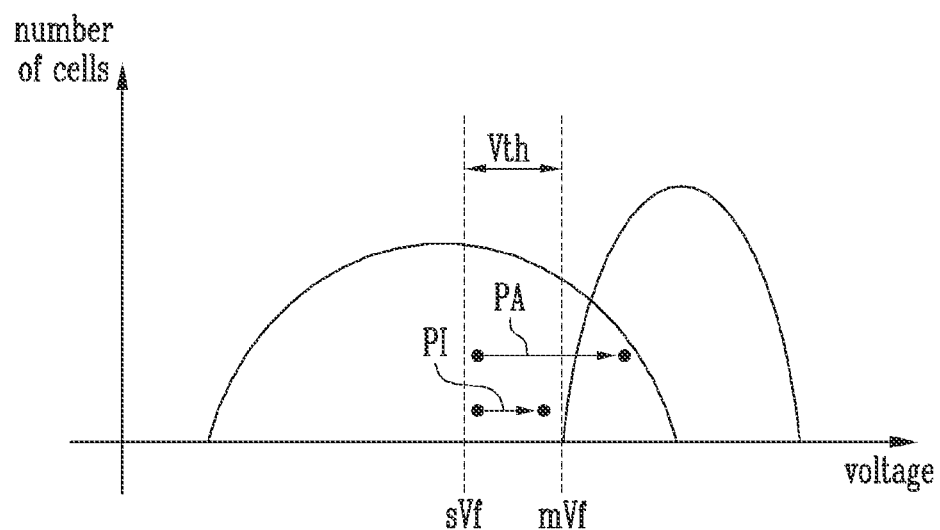
FIG. 12 is a diagram illustrating a threshold voltage change of memory cells in accordance with the present disclosure.

FIG. 12 is a diagram illustrating a threshold voltage change of memory cells in accordance with the present disclosure.

Referring to FIG. 12, when the second program allow voltage (2Val shown in FIG. 8 or 10) is constantly applied to bit lines connected to memory cells having a threshold voltage Vth between a main verify voltage mVf and a sub-verify voltage sVf in a program operation of the memory cells (PA), the memory cells may be influenced by a program voltage applied to a selected word line and the second program allow voltage 2Val applied to the bit lines. Therefore, in this case (PA), the threshold voltage of the memory cells may be increased according to a difference between the program voltage and the second program allow voltage 2Val (PA).

Because a threshold voltage of selected memory cells is increased as the program loop number increases, the selected memory cells may be over-programmed when the second program allow voltage 2Val is constantly applied to selected bit lines.

However, in accordance with the above-described first or second embodiment, when the program allow voltage applied to the bit lines connected to the memory cells having the threshold voltage Vth between the main verify voltage mVf and the sub-verify voltage sVf is increased stepwise from after the program loop number exceeds the reference number (PI), a potential difference between the selected word line and the bit lines may decrease. Thus, the over-program of the memory cells having the threshold voltage between the main verify voltage mVf and the sub-verify voltage sVf can be prevented.

Figure 13:
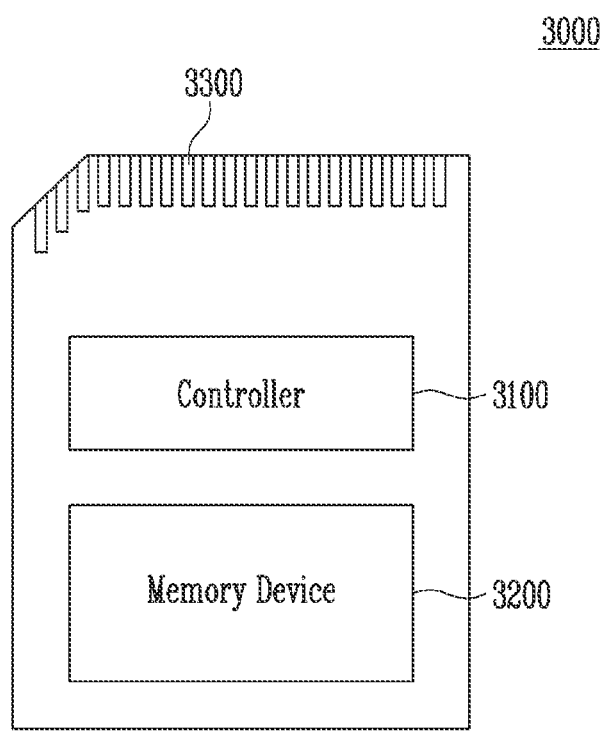
FIG. 13 is a diagram illustrating a memory card system to which a memory device of the present disclosure is applied.

FIG. 13 is a diagram illustrating a memory card system to which a memory device of the present disclosure is applied.

Referring to FIG. 13, the memory card system 3000 includes a controller 3100, a memory device 3200, and a connector 3300.

The controller 3100 may be connected to the memory device 3200. The controller 3100 may access the memory device 3200. For example, the controller 3100 may control a program, read, or erase operation, or control a background operation of the memory device 3200. The controller 3100 may provide an interface between the memory device 3200 and a host. The controller 3100 may drive firmware for controlling the memory device 3200. For example, the controller 3100 may include components such as Random Access Memory (RAM), a processing unit, a host interface, a memory interface, and the error corrector.

The controller 3100 may communicate with an external device through the connector 3300. The controller 3100 may communicate with the external device (e.g., the host) according to a specific communication protocol. For example, the controller 3100 may communicate with the external device through at least one of various communication protocols such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), firewire, a Universal Flash Storage (UFS), Wi-Fi, Bluetooth, and NVMe. For example, the connector 3300 may be defined by at least one of the above-described various communication protocols.

The memory device 3200 may include memory cells, and be configured identically to the memory device 100 shown in FIG. 1. Therefore, the memory device 3200 may adjust pass voltages applied to unselected word lines in a read operation as described in the above-described embodiments.

The controller 3100 and the memory device 3200 may be integrated into a single semiconductor device, to constitute a memory card. For example, the controller 3100 and the memory device 3200 may constitute a memory card such as a personal computer (PC) card (Personal Computer Memory Card International Association (PCMCIA)), a Compact Flash (CF) card, a Smart Media Card (SM and SMC), a memory stick, a Multi-Media Card (MMC, RS-MMC, MMCmicro and eMMC), an SD card (SD, miniSD, microSD and SDHC), and a Universal Flash Storage (UFS).

Figure 14:
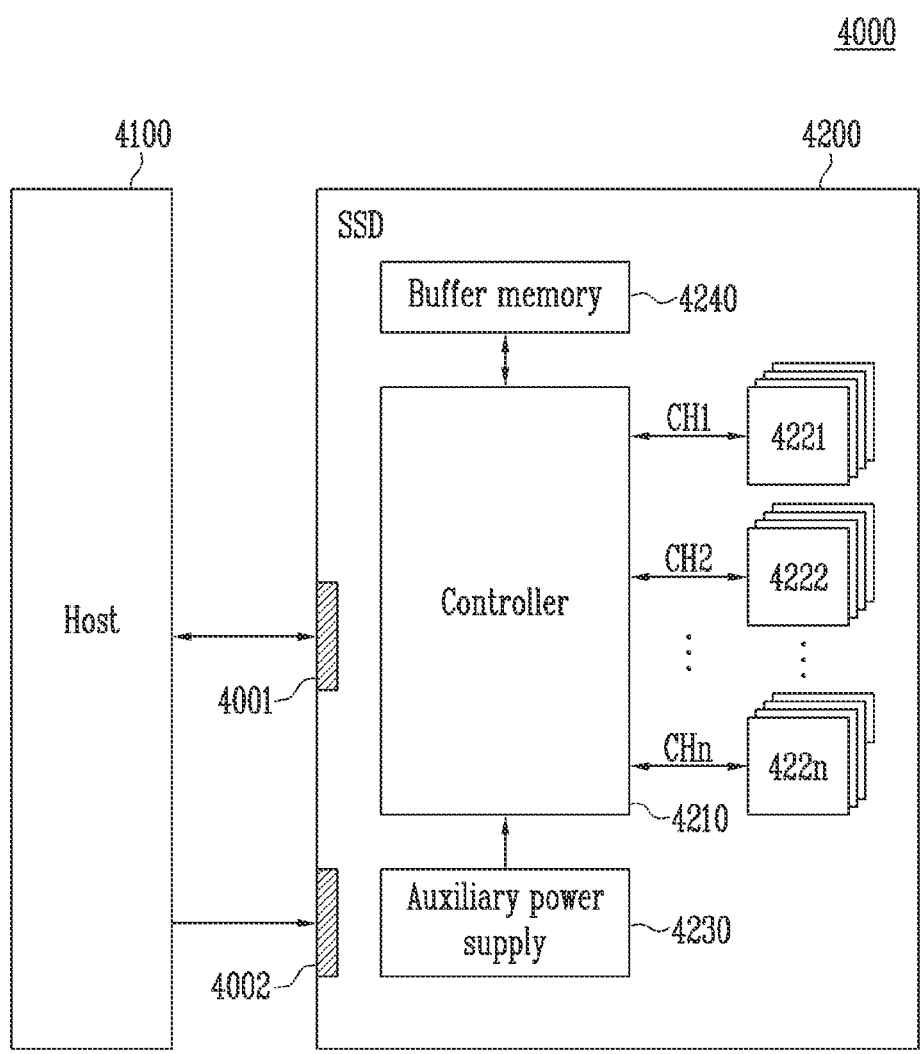
FIG. 14 is a diagram illustrating a Solid State Drive (SSD) system to which a memory device of the present disclosure is applied.

FIG. 14 is a diagram illustrating a Solid State Drive (SSD) system to which a memory device of the present disclosure is applied.

Referring to FIG. 14, the SSD system 4000 includes a host 4100 and an SSD 4200. The SSD 4200 exchanges a signal with the host 4100 through a signal connector 4001, and receives power through a power connector 4002. The SSD 4200 includes a controller 4210, a plurality of memory devices 4221 to 422n, an auxiliary power supply 4230, and a buffer memory 4240.

The controller 4210 may control the plurality of memory devices 4221 to 422n in response to a signal received from the host 4100. For example, the signal may be a signal based on an interface between the host 4100 and the SSD 4200. For example, the signal may be a signal defined by at least one of interfaces such as a Universal Serial Bus (USB), a Multi-Media Card (MMC), an embedded MMC (eMMC), a Peripheral Component Interconnection (PCI), a PCI express (PCIe), an Advanced Technology Attachment (ATA), a Serial-ATA (SATA), a Parallel-ATA (PATA), a Small Computer System Interface (SCSI), an Enhanced Small Disk Interface (ESDI), an Integrated Drive Electronics (IDE), a firewire, a Universal Flash Storage (UFS), a WI-FI, a Bluetooth, and an NVMe.

The plurality of memory devices 4221 to 422n may include a plurality of memory cells configured to store data. Each of the plurality of memory devices 4221 to 422n may be configured identically to the memory device 100 shown in FIG. 1. Therefore, each of the plurality of memory devices 4221 to 422n may adjust pass voltages applied to unselected word lines in a read operation as described in the above-described embodiments. The plurality of memory devices 4221 to 422n may communicate with the controller 4210 through channels CH1 to CHn.

The auxiliary power supply 4230 may be connected to the host 4100 through the power connector 4002. The auxiliary power supply 4230 may receive power input from the host 4100 and charge the power. When the supply of power from the host 4100 is not smooth, the auxiliary power supply 4230 may provide power of the SSD 4200. For example, the auxiliary power supply 4230 may be located in the SSD 4200, or be located at the outside of the SSD 4200. For example, the auxiliary power supply 4230 may be located on a main board, and provide auxiliary power to the SSD 4200.

The buffer memory 4240 may operate as buffer memory of the SSD 4200. For example, the buffer memory 4240 may temporarily store data received from the host 4100 or data received from the plurality of memory devices 4221 to 422*n*, or temporarily store meta data (e.g., a mapping table) of the memory devices 4221 to 422*n*. The buffer memory 4240 may include volatile memory such as DRAM, SDRAM, DDR SDRAM, LPDDR SDRAM, and GRAM or nonvolatile memory such as FRAM, ReRAM, STT-MRAM, and PRAM.

In accordance with the present disclosure, the reliability of a program operation can be improved, and thus the reliability of the memory device can be improved.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A memory device comprising:
   a plurality of memory cells connected between word lines and bit lines;
   a voltage generator configured to generate a program voltage or a pass voltage, which is applied to the word lines;
   a page buffer group configured to apply program allow voltages or a program inhibit voltage to the bit lines; and
   a control circuit configured to control the voltage generator and the page buffer group in response to a command,
   wherein, in a program operation of selected memory cells connected to a selected word line among the word lines, the control circuit controls the page buffer group such that the program allow voltages are increased stepwise according to a number of program loops performed on the selected memory cells.

2. The memory device of claim 1, wherein the page buffer group includes page buffers connected to the bit lines, and
   wherein each of the page buffers is configured to apply the program inhibit voltage or the program allow voltages to the bit lines under the control of the control circuit.

3. The memory device of claim 1, wherein the page buffer group is configured to:
   apply the program allow voltages to selected bit lines among the bit lines; and
   apply the program inhibit voltage to unselected bit lines among the bit lines.

4. The memory device of claim 1, wherein the page buffer group is configured to apply the program allow voltages to selected bit lines among the bit lines, while the program voltage is applied to the selected word line.

5. The memory device of claim 1, wherein the program allow voltages are set lower than the program inhibit voltage.

6. The memory device of claim 1, wherein the control circuit is configured to:
   set a main verify voltage corresponding to a target voltage and a sub-verify voltage lower than the main verify voltage; and
   sequentially perform a sub-verify operation using the sub-verify voltage and a main verify operation using the main verify voltage in the program operation.

7. The memory device of claim 6, wherein the control circuit controls the page buffer group to:
   apply a first program allow voltage which is lowest among the program allow voltages to bit lines connected to memory cells having a threshold voltage lower than the sub-verify voltage among the selected memory cells; and
   apply a second program allow voltage or a third program allow voltage, which are both higher than the first program allow voltage, to bit lines connected to memory cells having a threshold voltage between the sub-verify voltage and the main verify voltage among the selected memory cells.

8. The memory device of claim 7, wherein, while the program voltage is applied to the selected word line, the control circuit controls the page buffer group to apply the second program allow voltage to bit lines connected to memory cells having a threshold voltage between the sub-verify voltage and the main verify voltage among the selected memory cells, or apply the second program allow voltage and the third program allow voltage to the bit lines connected to the memory cells having the threshold voltage between the sub-verify voltage and the main verify voltage among the selected memory cells.

9. The memory device of claim 8, wherein the control circuit controls the page buffer group such that as the number of program loops increases, a level of the third program allow voltage becomes higher.

10. The memory device of claim 8, wherein the control circuit controls the page buffer group such that as the number of program loops increases, a time at which the third program allow voltage is applied becomes earlier so that a time interval over which the third program allow voltage is applied becomes longer.

11. The memory device of claim 8, wherein the control circuit controls the page buffer group such that as the number of program loops increases, a level of the third program allow voltage becomes higher, and a time at which the third program allow voltage is applied becomes earlier so that a time interval over which the third program allow voltage is applied becomes longer.

12. The memory device of claim 8, wherein, when the number of program loops is equal to or smaller than a reference number, the control circuit controls the page buffer group to constantly apply the second program allow voltage to bit lines connected to memory cells having a threshold voltage between the sub-verify voltage and the main verify voltage.

13. The memory device of claim 8, wherein, when the number of program loops is greater than a reference number, the control circuit controls the page buffer group such that a level of the third program allow voltage becomes higher with increasing number of program loops, after the second program allow voltage is applied, for a certain time, to bit lines connected to memory cells having a threshold voltage between the sub-verify voltage and the main verify voltage.

14. The memory device of claim 8, wherein, when the number of program loops is greater than a reference number, the control circuit controls the page buffer group to apply the third program allow voltage having a constant level, after the second program allow voltage is applied, for a certain time, to bit lines connected to memory cells having a threshold voltage between the sub-verify voltage and the main verify voltage.

15. The memory device of claim 14, wherein the control circuit controls the page buffer group such that a time at which the third program allow voltage is applied to the bit lines becomes earlier as the number of program loops increases so that a time interval over which the third program allow voltage is applied becomes longer.

16. The memory device of claim 8, wherein, when the number of program loops is greater than a reference number, the control circuit controls the page buffer group to apply the third program allow voltage to the bit lines such that as the number of program loops increases, a level of the third program allow voltage becomes higher and a time for which the third program allow voltage is applied to the bit lines becomes earlier so that a time interval over which the third program allow voltage is applied becomes longer, after the second program allow voltage is applied, for a certain time, to bit lines connected to memory cells having a threshold voltage between the sub-verify voltage and the main verify voltage.

17. A method of operating a memory device, the method comprising:
applying a program inhibit voltage to unselected bit lines connected to unselected memory cells, while a program voltage is applied to a selected word line connected to selected memory cells;
applying a first program allow voltage to first selected bit lines connected to memory cells having a threshold voltage lower than a sub-verify voltage among the selected memory cells, while the program voltage is applied to the selected word line;
applying a second program allow voltage higher than the first program allow voltage to second selected bit lines connected to memory cells having a threshold voltage between a main verify voltage higher than the sub-verify voltage and the sub-verify voltage among the selected memory cells, while the program voltage is applied to the selected word line; and
applying a third program allow voltage higher than the second program allow voltage to the second selected bit lines to which the second program allow voltage is applied according to a number of program loops performed on the selected memory cells.

18. The method of claim 17, wherein the third program allow voltage is lower than the program inhibit voltage.

19. The method of claim 17, wherein, as the number of program loops increases, a level of the third program allow voltage becomes higher.

20. The method of claim 17, wherein, as the number of program loops increases, a time at which the third program allow voltage is applied to the second selected bit lines becomes earlier so that a time interval over which the third program allow voltage is applied becomes longer.

21. The method of claim 17, wherein, when the number of program loops is equal to or smaller than a reference number, the second program allow voltage is constantly applied to the second selected bit lines.

22. The method of claim 17, wherein, when the number of program loops is greater than a reference number, the third program allow voltage is applied, after the second program allow voltage is applied to the second selected bit lines for a certain time.

23. The method of claim 22, wherein the third program allow voltage increases with increasing number of program loops.

24. The method of claim 22, wherein a time at which the third program allow voltage is applied to the second selected bit lines becomes earlier as the number of program loops increases so that a time interval over which the third program allow voltage is applied becomes longer.

25. The method of claim 22, wherein, as the number of program loops increases, a level of the third program allow voltage becomes high stepwise and a time at which the third program allow voltage is applied to the second selected bit lines becomes earlier so that a time interval over which the third program allow voltage is applied becomes longer.

* * * * *